United States Patent [19]

Proebsting

[11] Patent Number: 6,031,783
[45] Date of Patent: Feb. 29, 2000

[54] HIGH SPEED VIDEO FRAME BUFFER

[75] Inventor: Robert J. Proebsting, Los Altos Hill, Calif.

[73] Assignee: Townsend and Townsend and Crew LLP, San Francisco, Calif.

[21] Appl. No.: 09/179,260

[22] Filed: Oct. 26, 1998

Related U.S. Application Data

[62] Division of application No. 08/884,845, Jun. 30, 1997, Pat. No. 5,793,383
[60] Provisional application No. 60/023,955, Aug. 6, 1996.
[51] Int. Cl.[7] .................................................... G11C 7/00
[52] U.S. Cl. ................................. 365/230.03; 365/221
[58] Field of Search ........................... 365/230.03, 221, 365/219

[56] References Cited

U.S. PATENT DOCUMENTS

| | | | |
|---|---|---|---|
| 4,663,735 | 5/1987 | Novak et al. .................... | 365/189.05 |
| 4,689,741 | 8/1987 | Redwine et al. .................... | 365/189.05 |
| 4,720,819 | 1/1988 | Pinkham et al. .................... | 365/219 |
| 5,805,522 | 9/1998 | Sukegawa et al. .................... | 365/230.03 |
| 5,812,481 | 9/1998 | Numata et al. .................... | 365/230.03 |
| 5,822,268 | 10/1998 | Kirihata .................... | 365/230.03 |

*Primary Examiner*—Son T. Dinh
*Attorney, Agent, or Firm*—Townsend and Townsend and Crew LLP

[57] ABSTRACT

A memory circuit achieves much higher bandwidth and reduced power consumption by maintaining the maximum number of memory arrays open simultaneously. Circuit area is also saved by sharing bit line sense amplifiers between adjacent arrays. When selected, an array remains open until a different row in the same array or an array adjacent to it is selected. Thus, as long as access is made to an open row of every other array, access time and power are reduced by eliminating the need to turn arrays on and off.

15 Claims, 3 Drawing Sheets

HIGH SPEED VIDEO FRAME BUFFER

This application is a Division of and claims the benefit of U.S. application No. 08/884,845, filed Jun. 30, 1997, which is a Continuation of Provisional application No. 60/023,955, filed Aug. 6, 1996, the disclosures of which are incorporated herein by reference.

BACKGROUND OF THE INVENTION

This invention relates in general to video electronics, and in particular to a high speed video display memory using dynamic memory cells implemented on the same chip as the video display controller.

A typical computer system includes a video card that carries the circuitry for processing video signals and for driving the display panel. FIG. 1 shows a conventional video card 100 that includes a display memory chip 102 (sometimes referred to as a frame buffer) connected to a controller chip 104 via input/output (I/O) pins 106. Display memory 102 stores data that represent the color or intensity of light for every picture cell (pixel) on the video screen, and controller 104 processes the data and drives the display. A drawback of this type of system is limited bandwidth between the memory and the controller caused by the limited number of data input/output pins 106 on the two chips.

It is desirable to substantially increase the rate of data transfer between the video memory and the video processor. Using a memory system with multiple banks improves the bandwidth somewhat. For example, dual-bank video memories have been developed whereby two word lines one from each bank can be selected at the same time. While some improvement is achieved by this design, still higher bandwidths are required.

Integrating both the memory circuit and the controller on the same chip is a solution that promises a significant increase in the bandwidth. With the memory on the same chip as the processor, instead of e.g., 32 bits over 32 I/O pins, 128 or 256 bits can be accessed internally at very high speeds.

SUMMARY OF THE INVENTION

The present invention offers an improved video memory circuit that is integrated on the same chip as the video controller. The memory circuit is arranged in a plurality of memory cell arrays that are separated by clusters of sense amplifiers. Each cluster of sense amplifiers is shared by two adjacent dynamic memory arrays resulting in a compact design that minimizes circuit area.

In a typical dynamic memory, such as a dynamic random access memory (DRAM), access to a given cell usually occurs in two steps. First a row is open then a column within that row is selected. Access to a column in a previously open row is relatively fast while access to a column in any other row is slow. Instead of activating an array only when a word line from that array is selected and then turning the array off after the data has been accessed, the present invention maintains the maximum number of arrays activated at any given time. That is, once an array is selected, it is not turned off until it receives a command from the processor selecting a new row in that array or an array adjacent to it. Because in the memory circuit of the present invention adjacent arrays share the same group of sense amplifiers, when the memory receives a new command selecting a word line from array N, any previously selected word lines from array N as well as arrays N−1 and N+1 are first turned off. The bit lines are then equilibrated and array N is then reopened to the appropriate address. The processor keeps track of which arrays are active and which rows are selected and which ones are off.

This scheme allows half of the arrays to be selected at the same time. By specifically organizing the data such that a large number of adjacent pixels that are typically manipulated together are stored within those arrays that can be active simultaneously, the memory bandwidth is maximized. For example, the display screen can be divided into a bottom half and a top half. Pixel data corresponding to the bottom half can be stored in for example all odd numbered arrays and pixel data corresponding to the top half can be stored in the even numbered arrays. Since most of the time all pixel data that are manipulated as a group would be stored in either even numbered or odd numbered arrays, all of those arrays can be accessed at one time, and as many word lines as half the number of arrays in the memory can be selected simultaneously. Thus, access to read or write the memory is provided at a very high bandwidth. There is also less power consumed as the word lines are not turned off and on for every access.

Accordingly, in one embodiment, the present invention provides a method for operating a memory circuit having a plurality of arrays including the steps of (a) receiving a command accessing array N, (b) turning off arrays N, N+1 and N−1, (c) equilibrating bit lines in array N, and (d) turning on array N to access a selected word line.

In another embodiment, the present invention provides a method for operating a memory circuit having a plurality of arrays including the steps of (a) receiving a first command accessing a row in a first array, (b) turning on the first array to allow access to memory cells in that row, and (c) keeping the first array open until it receives a second command accessing a new row in the first array. The method further includes a step of turning off the first array upon receipt of the second command, and turning off a second array adjacent to the first array.

A better understanding of the nature and advantages of the high speed video memory circuit of the present invention may be had with reference to the detailed description and the drawings below.

DESCRIPTION OF SPECIFIC EMBODIMENTS

Figure 2:
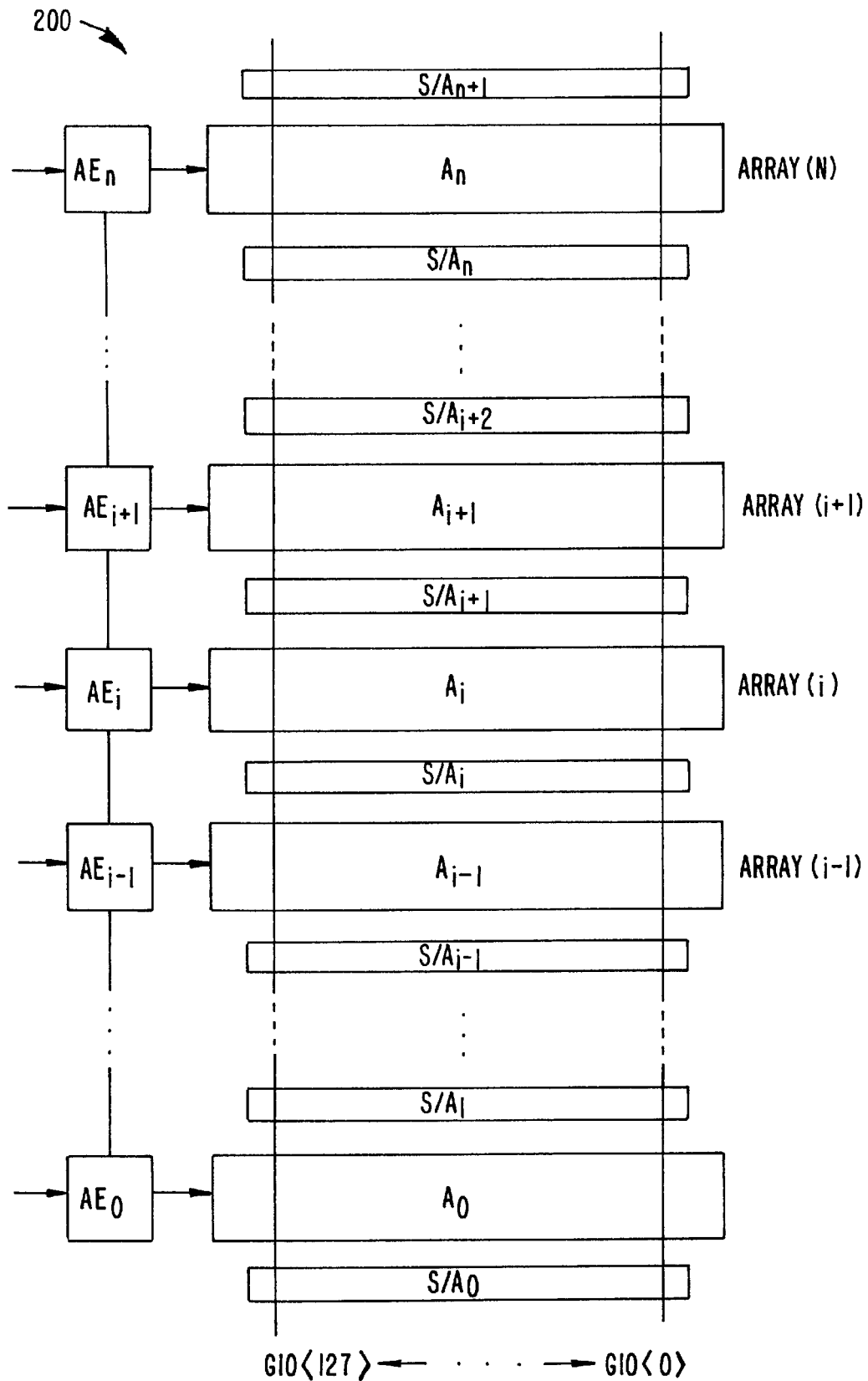
FIG. 2 is a conceptual block diagram of the multiple-array memory circuit according to the present invention.

Referring to FIG. 2, there is shown a block diagram of a memory circuit 200 having multiple arrays $A_0$ to $A_n$ according to one embodiment of the present invention. An array $A_i$ may include for example 256 rows of e.g., 1024 memory cells. With these exemplary numbers, each array stores 256 Kbits of data. To reduce the size of the memory circuit, according to a preferred embodiment of the present invention, adjacent arrays share clusters of bit line sense amplifiers $S/A_1$ to $S/A_n$. With the example used herein, each cluster of sense amplifiers includes 512 individual sense amplifier circuits that serve two arrays one on either side.

Data is written into and read from the memory cells in each array via multiple global input/output GIO lines that selectively connect to the bit lines in arrays $A_0$ to $A_n$ via column select circuits (not shown). The width of this data bus corresponds to the memory I/O bus that connects the memory to the controller on the same die. There may be, for example, 128 parallel differential pairs of GIO lines GIO<0> to GIO<127> that traverse the entire array. In such an exemplary case, there would be a corresponding number (128) of write driver and I/O sense amplifier circuits (not shown) that connect the memory I/O bus to the 128 pairs of GIO lines. Each array $A_i$ further connects to an output terminal of an array enable circuit $AE_i$. An array enable circuit $AE_i$ turns its associated array $A_i$ on or off in response to control signals it receives from the video controller (not shown).

For illustrative purposes, FIG. 2 depicts arrays $A_0$ to $A_n$ stacked in a single column of arrays. The arrays may in fact be grouped into two or more stacks. For example, the memory circuit may include 64 arrays of 1024×256 bits grouped as four stacks of 16 arrays each. With one qualification, each array $A_i$ operates almost as an independent memory unit via the common memory I/O bus. Because neighboring arrays in the memory circuit of the present invention share bit line sense amplifiers, two adjacent arrays are not permitted to simultaneously have open rows. Thus, the memory circuit allows up to half of the arrays to have open rows at any given time. Using the above exemplary numbers, given 64 1024-bit wide arrays, there will be 32 Kbits available for column access. According to this invention, once an array is activated on a row, it remains active on that row until it is activated on a different row or until one of its neighboring arrays is activated. Thus, repeated accesses can be made to the same row of up to 32 already activated arrays without having to go through a precharge cycle. The row addresses of the open rows need not be the same. This technique allows for maximizing the memory bandwidth by organizing and storing pixel data in the various arrays to take full advantage of the multiple simultaneously active arrays.

The following exemplary numbers are used herein to describe the operation of the memory circuit in greater detail. It is assumed that it will take 20 ns to precharge (turn off previously on row and equilibrate bit lines), 30 ns to select and turn on a new row, making a column access possible, and 20 ns from the time a column is selected until the data is made available, for a maximum access time of 70 ns. Accordingly, referring to FIG. 2, when a new row in an array $A_i$ is selected, regardless of whether that array or its two neighboring arrays $A_{i+1}$ and $A_{i-1}$ were on or off, the total access time would be 70 ns. This is slightly longer than a total access time of 50 ns for the prior art memories where the precharge time would not be included in the access time. In the prior art circuit, however, a selected row is usually shut down after the completion of the cycle. Thus, in this circuit if in a subsequent cycle access is made to a different column in the same row, the total access time remains 50 ns.

According to the present invention, however, once a specific row in an array is activated, that row remains open. Using the exemplary numbers, with the row already open, it takes only 20 ns to access a new column in that row. The controller may open a row in a second non-neighboring array while keeping the row in the first array open. A new array can be activated every 10 ns, provided it does not conflict with the activation in progress with a neighboring array. Continuing in that fashion, up to 32 of the 64 arrays may have simultaneously active rows. Thus, data can be accessed and transferred at a very fast rate as long as it resides in the various simultaneously active rows.

Figure 3:
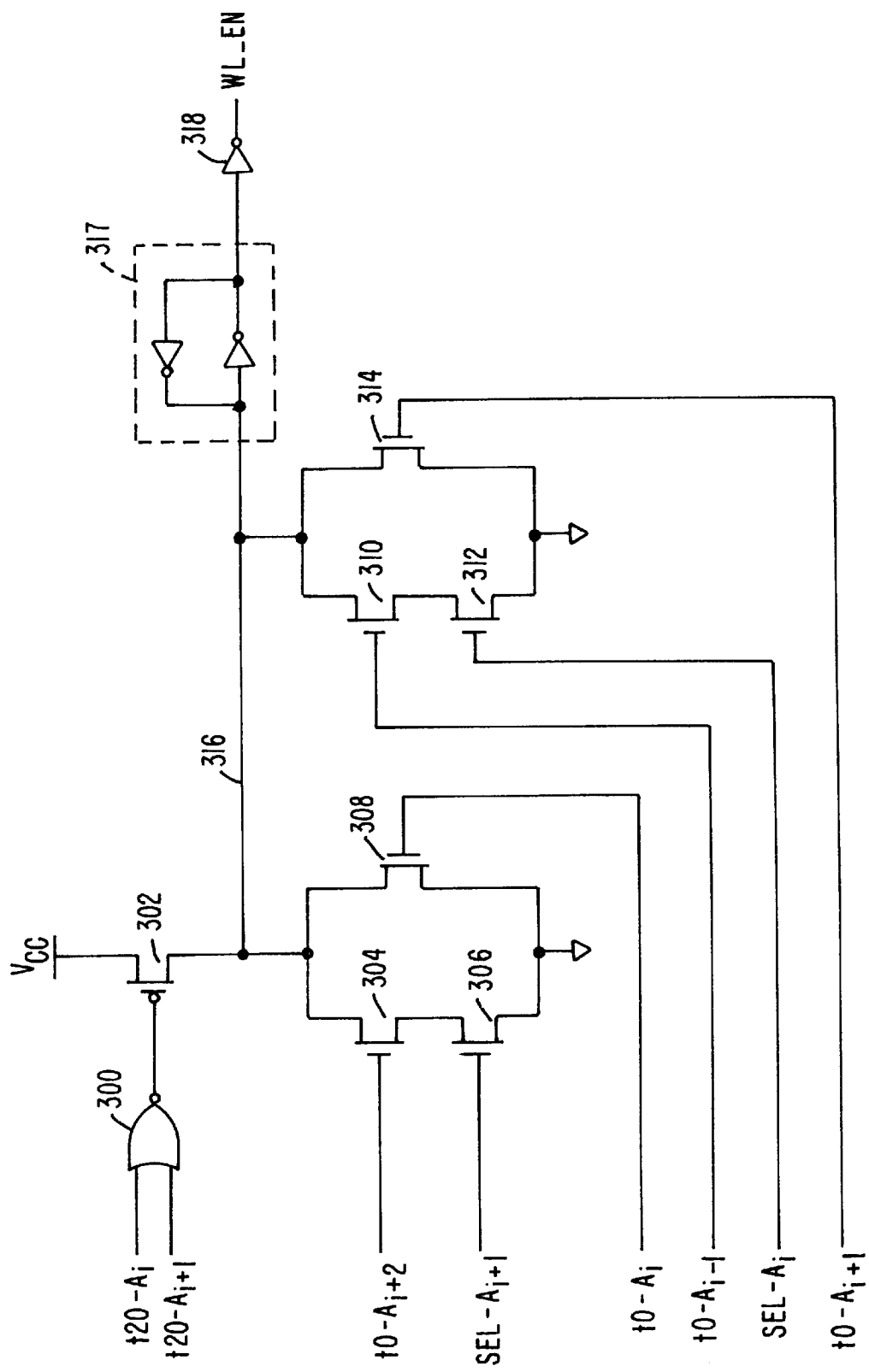
FIG. 3 is an exemplary circuit schematic of an array enable logic.

Referring to FIG. 3, there is shown an exemplary circuit diagram for the word line enable logic. The output of the exemplary circuit shown in FIG. 3 generates the word line enable signal WL_EN that activates a pump circuit that boosts the voltage level on the selected word line. To further reduce the circuit area, two adjacent memory arrays may share the word line boost circuit, since both cannot be active simultaneously. The shared word line boost circuit is the subject of a related pending U.S. Pat. No. 5,793,383 to Proebsting, entitled "Shared Bootstrap Circuit", which is hereby incorporated in its entirety for all purposes.

Assuming a given word line enable signal WL_EN drives a word line boost circuit that is shared by arrays $A_i$ and $A_{i+1}$, the word line enable logic must implement the following functions:

(1) At time $t_0$, WL_EN is turned OFF when either one of arrays $A_i$ or $A_{i+1}$ is activated.

(2) At time $t_{20}$, WL_EN is turned ON when either one of arrays $A_i$ or $A_{i+1}$ is activated.

(3) At time $t_0$ WL_EN is turned OFF when array $A_{i-1}$ is activated when array $A_i$ was active.

(4) At time $t_0$ WL_EN is turned OFF when array $A_{i+2}$ is activated when array $A_{i+1}$ was active.

As described above, when a new row in an array is selected, according to the present invention, any open rows in that array are first turned off at time $t_0$ to allow for precharging. Condition (1) is implemented by transistors 308 or 314. When array $A_i$ or $A_{i+1}$ is activated, signals $t_0$–$A_i$ or $t_0$–$A_{i+1}$ are respectively asserted at time $t_0$ and de-asserted before time $t_{20}$. When signal $t_0$–$A_i$ goes high, transistor 308 is turned on pulling node 316 down to ground, overpowering latch 317. Signal WL_EN is turned low turning off the previously selected word line. Similarly, when signal $t_0$–$A_{i+1}$ goes high, transistor 314 is turned on, pulling node 316 down to ground, and causing WL_EN to go low.

Condition (2) refers to the turning on of the new word line in the array at time $t_{20}$ upon completion of the precharge cycle and to access the selected row. This is accomplished by NOR gate 300 and PMOS transistor 302. When a logic high is applied to either one of the inputs $t_{20}$–$A_i$ or $t_{20}$–$A_{i+1}$, transistor 302 is turned on pulling node 316 up to Vcc, again powering latch 317. This causes WL_EN to go high activating the new selected word line.

The other two conditions refer to when a new array ($A_{i-1}$ or $A_{i+2}$) is selected at time $t_0$ adjacent to an already selected array ($A_i$ or $A_{i+1}$). In either case, a pair of transistors 304/306 or 310/312 are turned on pulling node 316 down to ground, and causing WL_EN to turn off.

Figure 1:
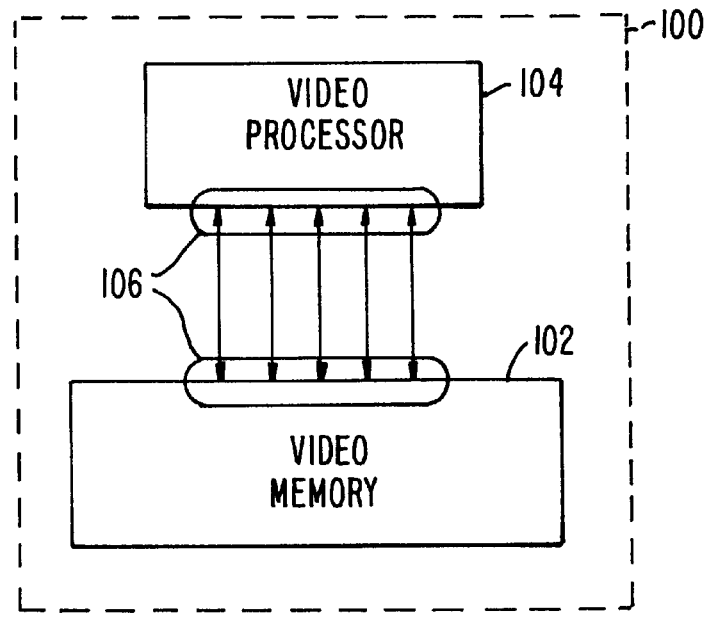
FIG. 1 is a simplified block diagram of a video card including a memory chip and a controller chip.
Figure 4:
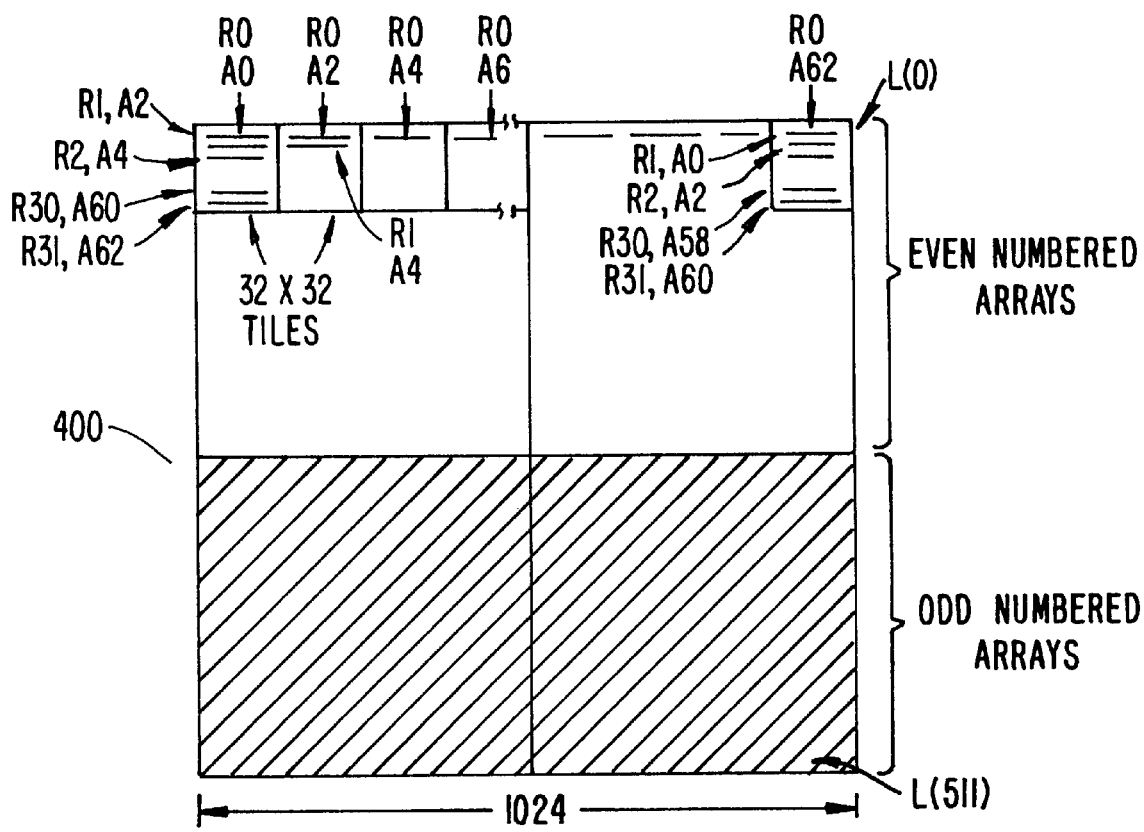
FIG. 4 illustrates exemplary divisions of pixels on a video display screen for data storage in the memory arrays to maximize memory bandwidth according the present invention.

To maximize the bandwidth, the preferred embodiment of the present invention maximizes the likelihood of consecutive accesses to already open rows. This can be accomplished by cleverly dividing where in the array pixel data is stored. Referring to FIG. 4, there is shown a simplified video screen 400 of, for example, 1024×512 size. The video controller processes pixel data in two modes. When displaying the pixels, the screen is scanned horizontally starting from the top line L(0) to the bottom line L(511) of the screen. At other times, the controller may processes a, for example, 32×32 tile of pixels.

One example of distributing pixel data to take advantage of the open arrays in the memory circuit of the present invention divides the screen into a top half and a bottom half. Pixel data corresponding to the top half of the screen are stored in even numbered memory arrays, and pixel data corresponding to the bottom half of the screen are stored in the odd numbered memory arrays. If each pixel is represented by 32 bits of data, then a 1024-bit row in an array can store data corresponding to 32 pixels. Accordingly, the first group 32 pixels in line L(0) are stored in row 0 of array 0, the second group of 32 pixels in line L(0) are stored in row 0 of array 2, the third group of 32 pixels in line L(0) are stored in row 0 of array 4, etc. With this type of distribution, all the data required to display line L(0) on the screen 400 can be simultaneously available in already open rows in even numbered arrays.

A similar distribution technique is preferably employed for storing each 32×32 tile of pixels. That is, the first row of the first tile is stored in Row 0 of Array 0 as discussed. The second row of the first tile is stored in Row 1 of Array 2, etc. This distribution is partially shown in FIG. 4. With each row of a given tile in different arrays which can be simultaneously open, all the data for a given tile can be in open rows. When data is manipulated in tiles, performance significantly improves by fast access to the full contents of any tile. Thus, data is transferred at a significantly faster rate as long as consecutive accesses are made to the same set of open rows. Power dissipation is also reduced by reducing the number of times arrays are required to be turned off and on. It is to be understood that other common screen sizes such as 1024×678 or 1280×1024 as well as other numbers of bits per pixel such as 8, 16, or 24 can also be arranged with an appropriate memory size to open either a full row of screen data or a full tile.

In conclusion, the present invention provides a memory circuit that is particularly suited for video applications. The memory circuit of the present invention achieves much higher bandwidth and reduced power consumption by maintaining the maximum number of memory arrays open simultaneously. Circuit area is also saved by sharing bit line sense amplifiers between adjacent arrays. A specific video memory circuit which incorporates an exemplary embodiment of the present invention as well as other related circuit techniques is described in greater detail in the article entitled "An Embedded Frame Buffer for Graphics Applications," attached herein as Appendix A.

While the above is a complete description of specific embodiments of the present invention, various modifications, variations and alternatives may be employed. The scope of this invention, therefore, should not be limited to the embodiments described, and should instead be defined by the following claims.

What is claimed is:

1. A video chip comprising:

a memory circuit;

controller logic; and a wide bus coupling said memory circuit to said controller logic, wherein, said memory circuit comprises:

a plurality of arrays of memory cells, each array having n columns and m rows, with a memory cell coupled at each cross section of a row and a column, a plurality of clusters of sense amplifiers, each of said plurality of arrays being sandwiched by a pair of said plurality of clusters of sense amplifiers, each cluster of sense amplifiers having n/2 sense amplifier circuits respectively coupling to n/2 columns in arrays on either sides of the cluster of sense amplifiers, and a plurality of array enable logic blocks respectively coupled to said plurality of arrays, wherein, each of said plurality of array enable logic blocks is configured to activate a selected array is response to a row access command, and to keep the selected array active until it receives a subsequent row access command accessing a different row in that array, or a row in an adjacent array sharing a cluster of sense amplifiers allowing said controller to access more data via said wide bus.

2. The video chip of claim 1 wherein video data representing video display pixel information are stored in said memory circuit whereby data representing one tile is stored in one row per array in non-adjoining arrays.

3. The video chip of claim 1 wherein said plurality of arrays are organized in two or more groups of arrays, and each array comprises at least 1024 columns and at least 256 rows.

4. The video chip of claim 1 wherein said wide bus is at least 128 bits wide.

5. The video chip of claim 2 wherein data comprising any given tile of pixels is stored substantially entirely in either even numbered arrays or substantially entirely in odd numbered arrays.

6. The video chip of claim 2 wherein said data comprising any given tile of pixels is stored in rows that can be simultaneously activated.

7. The video chip of claim 2 wherein data comprising any given screen display line is stored substantially entirely in one row per array in non-adjoining arrays.

8. The video chip of claim 7 wherein said data comprising any given screen display line is stored substantially entirely in either even numbered arrays or substantially entirely in odd numbered arrays.

9. The video chip of claim 8 wherein said data comprising any given screen display line is stored in rows that can be simultaneously activated.

10. The video chip of claim 5 wherein data comprising any given screen display line is stored substantially entirely in either even numbered arrays or substantially entirely in odd numbered arrays.

11. The video chip of claim 10 wherein said data comprising any given tile of pixels is stored in rows that can be simultaneously activated.

12. The video chip of claim 11 wherein said data comprising any given screen display line is stored in rows that can be simultaneously activated.

13. An image processing system comprising:

a video processor;

a memory circuit; and a bus coupling the video processor to the memory circuit, wherein, the memory circuit comprises:

a plurality of arrays of memory cells wherein the memory cells are arranged in rows and columns;

a plurality of banks of sense amplifiers coupled to the plurality of arrays of memory cells; and a plurality of array enable logic blocks respectively coupled to the plurality of arrays of memory cells, wherein, each array enable logic block is configured to activate its associated array in response to a first command accessing a row in that array, and to keep that array activated until it receives a subsequent second command accessing a different row in that array.

14. The image processing system of claim 13 wherein the memory circuit stores video data representing video display pixel information whereby data representing one tile is stored in one row per array in non-adjoining arrays.

15. The image processing system of claim 14 wherein the data representing any given tile of pixels is stored in rows that can be simultaneously activated.

* * * * *

UNITED STATES PATENT AND TRADEMARK OFFICE
CERTIFICATE OF CORRECTION

PATENT NO.    : 6,031,783
DATED         : February 29, 2000
INVENTOR(S)   : Proebsting It is certified that error appears in the above-identified patent and that said Letters Patent is hereby corrected as shown below:

<u>Title page,</u>
Item [63], Related U.S. Application Data, please correct "Division of application No. 08/884,845, Jun. 30, 1997, Pat. No. 5,793,383" to read -- Division of application No. 08/884,845, Jun. 30, 1997, Pat. No. 6,026,044 --

Signed and Sealed this

Twenty-sixth Day of November, 2002

*Attest:*

JAMES E. ROGAN
*Attesting Officer*     *Director of the United States Patent and Trademark Office*